United States Patent
Moscaluk

Patent Number: 6,097,231
Date of Patent: Aug. 1, 2000

[54] CMOS RC EQUIVALENT DELAY CIRCUIT

[75] Inventor: Gary P. Moscaluk, Divide, Colo.

[73] Assignee: Ramtron International Corporation, Colorado Springs, Colo.

[21] Appl. No.: 09/087,726

[22] Filed: May 29, 1998

[51] Int. Cl.[7] .................................................. H03H 11/26
[52] U.S. Cl. .......................... 327/264; 327/268; 327/278; 327/393
[58] Field of Search .................................... 327/261, 262, 327/264, 268, 278, 281, 283, 285, 288, 290, 392, 393, 394, 396, 399, 401

[56] References Cited

U.S. PATENT DOCUMENTS

| | | |
|---|---|---|
| 3,668,423 | 6/1972 | Couch . |
| 3,831,117 | 8/1974 | Fletcher et al. . |
| 3,943,385 | 3/1976 | Achtstaetter . |
| 4,204,242 | 5/1980 | Metzner . |
| 4,430,587 | 2/1984 | Tennyson . |
| 4,560,891 | 12/1985 | Ryczek . |
| 4,560,892 | 12/1985 | Ryczek . |
| 4,611,136 | 9/1986 | Fujie . |
| 4,837,466 | 6/1989 | Kanauchi . |
| 5,191,245 | 3/1993 | Kang ........................................ 307/601 |
| 5,523,711 | 6/1996 | Tachiyama ............................. 327/262 |
| 5,801,567 | 9/1998 | Kosiec ................................... 327/263 |

*Primary Examiner*—Toan Tran
*Assistant Examiner*—Quan Tra
*Attorney, Agent, or Firm*—Peter J. Meza, Esq.; Carol W. Burton, Esq.

[57] ABSTRACT

An RC equivalent delay circuit includes an input node, an output node, a feedback node, and an intermediate node; a first inverter having an input coupled to the input node and an output coupled to the intermediate node; a second inverter having an input coupled to the intermediate node and an output coupled to the feedback node; a third inverter having an input coupled to the feedback node and an output coupled to the output node; and one or two switches having a first input coupled to the input node, a second input coupled to the feedback node, and an output coupled to the intermediate node.

7 Claims, 11 Drawing Sheets

6,097,231

CM OS RC EQUIVALENT DELAY CIRCUIT

BACKGROUND OF THE INVENTION

This invention relates generally to resistor-capacitor ("RC") equivalent and delay circuits. More particularly, the present invention relates to a circuit configuration for a CMOS RC equivalent delay circuit.

It is often desirable to use CMOS devices in analog circuit design wherever possible, since many integrated circuit chips involve CMOS processing. This is especially true when the size of the integrated circuit chip is an important engineering consideration. A typical prior art RC delay circuit includes N-well, N-plus, or P-plus resistors along with NMOS or PMOS capacitors. These circuit elements provide the desired electrical performance characteristics, but are relatively large, and therefore tend to take up a substantial amount of integrated circuit space. In turn, this can lead to unnecessarily large integrated circuit area, which adversely impacts unit cost.

What is desired is a CMOS RC equivalent delay circuit that takes up much less integrated circuit space than conventional CMOS RC circuits.

SUMMARY OF THE INVENTION

It is, therefore, a principal object of the present invention to provide a CMOS RC equivalent delay circuit that minimizes integrated circuit die area and cost.

It is another object of the invention to design a CMOS RC delay circuit that can maintain circuit performance despite variations in process, voltage and temperature.

According to the present invention an RC equivalent delay circuit includes an input node, an output node, a feedback node, and an intermediate node; a first inverter having an input coupled to the input node and an output coupled to the intermediate node; a second inverter having an input coupled to the intermediate node and an output coupled to the feedback node; a third inverter having an input coupled to the feedback node and an output coupled to the output node; and one or two switches having a first input coupled to the input node, a second input coupled to the feedback node, and an output coupled to the intermediate node.

The foregoing and other objects, features and advantages of the invention will become more readily apparent from the following detailed description of a preferred embodiment of the invention which proceeds with reference to the accompanying drawings.

BRIEF DESCIRIPTION OF THE DRAWINGS

DETAILED DESCRIPTION

Figure 1:
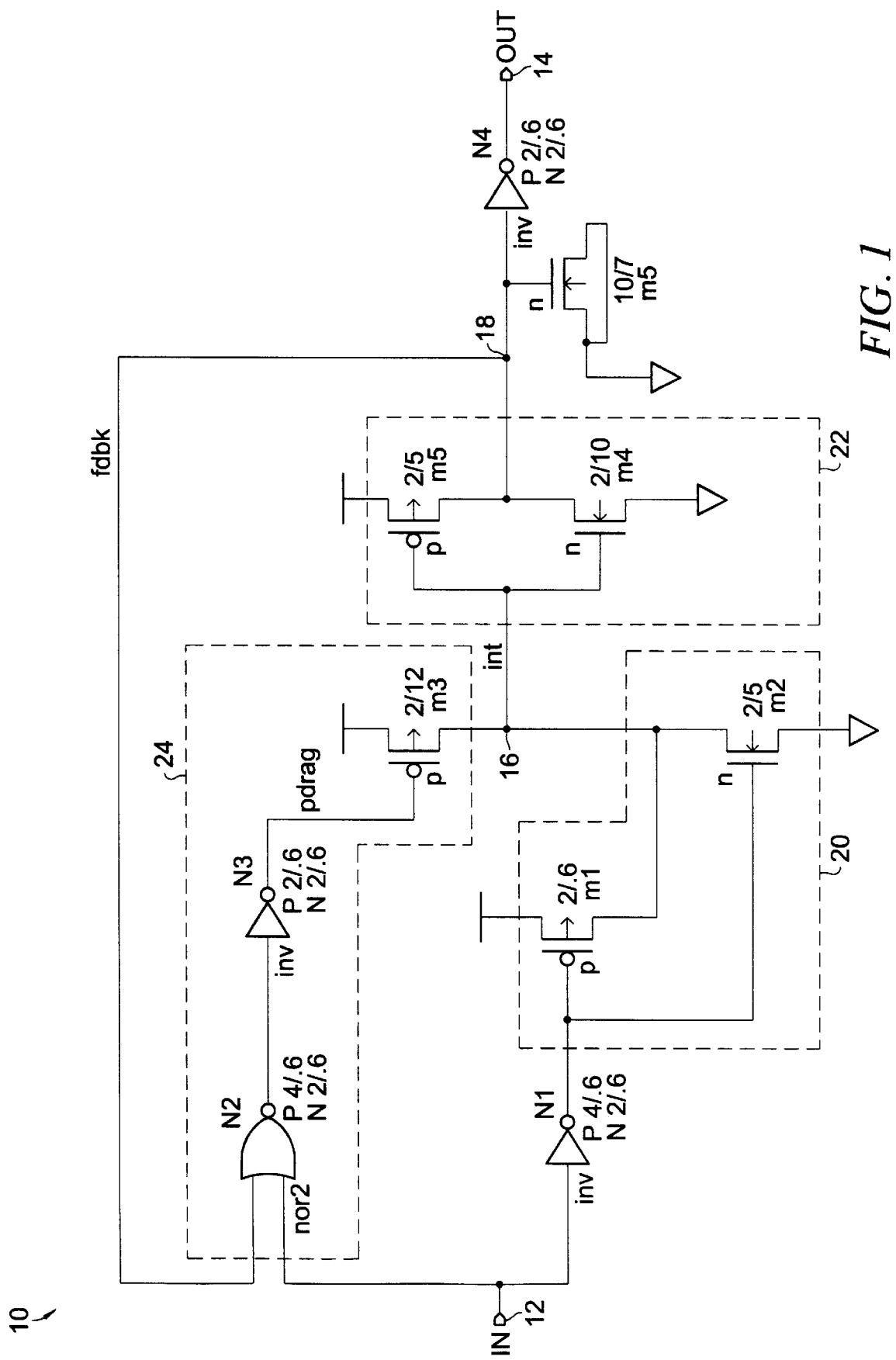
FIG. 1 is a schematic diagram of a first embodiment of an RC equivalent delay circuit according to the present invention.

Referring now to FIG. 1, a delay circuit 10 includes an input node 12 designated IN, an output node 14 designated OUT, a feedback node 18 designated FDBK, and an intermediate node 16 designated INT. A first inverter 20 has an input coupled to the input node 12 though inverter N1 and an output coupled to the intermediate node 16. A second inverter 22 has an input coupled to the intermediate node 16 and an output coupled to the feedback node 18. A third inverter N4 has an input coupled to the feedback node 18 and an output coupled to the output node 14. A switch 24 has a first input coupled to the input node 12, a second input coupled to the feedback node 18, and an output coupled to the intermediate node 16.

The first inverter 20 includes a P-channel transistor m1 and an N-channel transistor m2 having coupled gates forming the input, and coupled drains forming the output. The second inverter 22 includes a P-channel transistor m5 and an N-channel transistor m4 having coupled gates forming the input, and coupled drains forming the output. Inverters Ni and N4 can also include coupled P-channel and N-channel transistors as described above.

In the delay circuit 10 shown in FIG. 1, switch 24 includes a NOR gate N2, an inverter N3, and a P-channel transistor m3. The first and second inputs of NOR gate N2 form the first and second inputs of switch 24, and the output of NOR gate N2 is coupled to the input of inverter N3. The output of inverter N3 is coupled to the gate of P-channel transistor m3, the source of P-channel transistor m3 is coupled to the VDD supply voltage source, and the drain of P-channel transistor m3 forms the output of the switch.

Delay circuit 10 further includes a capacitive load coupled to output node 14. In the preferred embodiment, the capacitive load is a capacitor-coupled N-channel transistor designated m6. The gate of transistor m6 forms one plate of the capacitor, and the coupled source and drain of transistor m6 forms the other plate of the capacitor.

Circuit Function

Figure 2:
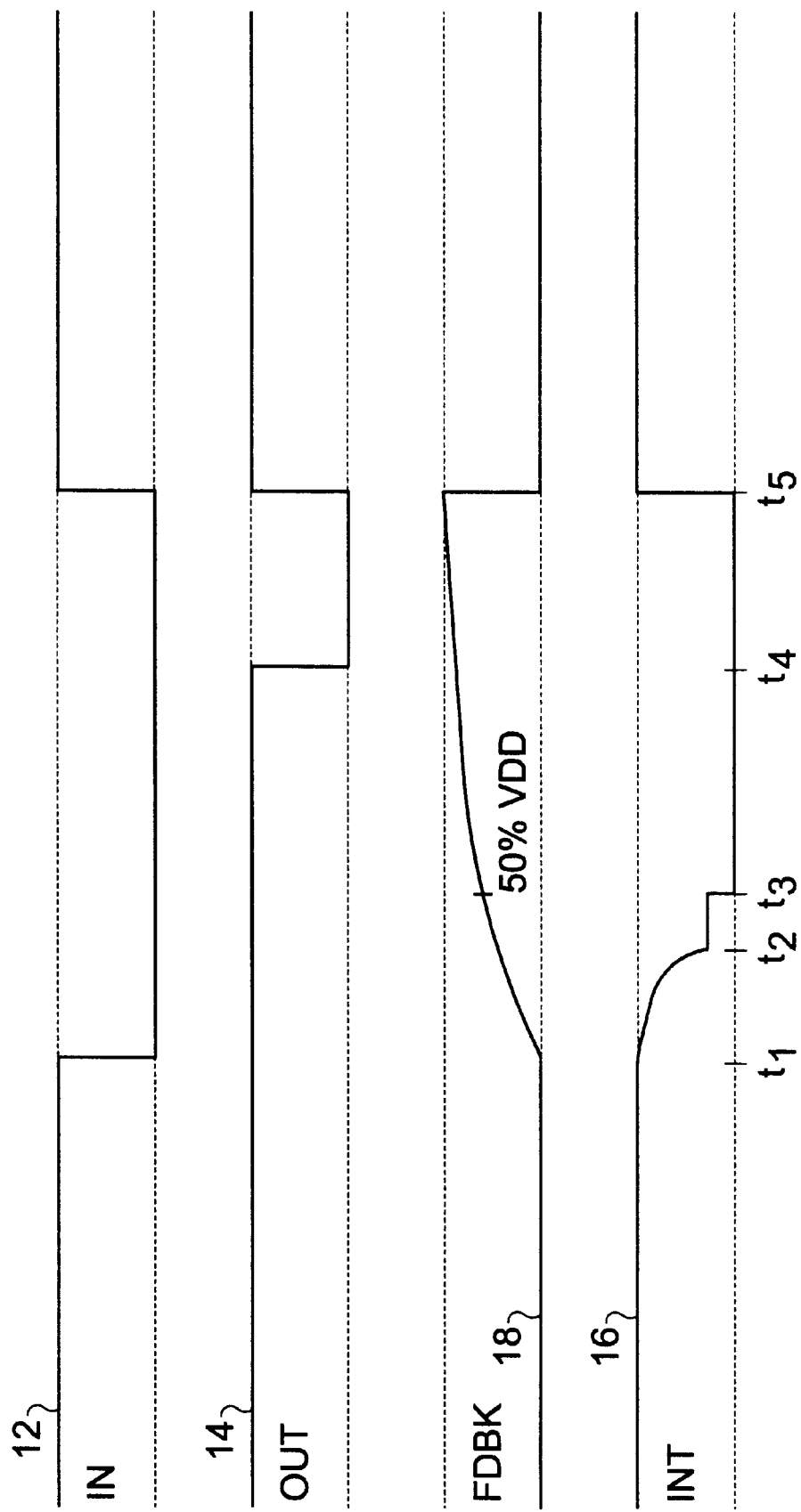
FIG. 2 is a timing diagram showing various waveforms associated with circuit nodes in the circuits of FIGS. 1 and 3.

The delay circuit 10 shown in FIG. 1 is a CMOS RC equivalent circuit and is designed to delay an input signal transitioning from high (VDD) to low (VSS) as shown in FIG. 2. Therefore, when the input signal IN is high, then the P-channel transistor m1 turns on supplying the output node 14, designated OUT, with a logic high. For this condition, there is very little time delay. The delay is due to the large L transistor m4 and the load capacitance of transistor m6. The feedback signal, FDBK, also supplies a low to the input of NOR gate N2, which initiates the switching of P-channel transistor m3. Since one of the inputs of NOR gate N2 is high, the output is low. The output of inverter N3 is thus high, and P-channel transistor m3 is in cutoff. Once the input signal IN becomes low, transistor m2 turns on, as well as transistor m3 via the two low input signals at NOR gate N2. Thus, transistors m2 and m3 are both on as a result both conducting. As INT node 16 slowly transitions from high to low because of the stronger N-channel transistor m2, a voltage reference is established on INT node 16 at the point of saturation. In other words, both transistors m2 and m3 are in saturation when the reference voltage is established. The voltage reference depends primarily on how transistors m2 and m3 are sized. For the design of the preferred embodiment, it is desirable to obtain a reference voltage at approximately 30% of the VDD supply voltage (1.5 volts for a five volt VDD supply voltage). The reference voltage is set so that there is a higher gate-to-source voltage (Vgs) on P-channel transistor m5, than on N-channel transistor m4. However, since a very slow response for the feedback signal is desired, a gate-to-source voltage (Vgs) is provided to P-channel transistor m5 that is as low as possible and yet high enough to slowly pull the FDBK node 18 towards the VDD supply voltage. As P-channel transistor m5 pulls the feedback signal FDBK towards VDD, the drain-to-source voltage (Vds) of N-channel transistor m4 increases causing the transistor to operate in the linear mode and increasing the drain-to-source current (Ids). To limit current flow, it is desirable to keep N-channel transistor m4 in the linear mode of operation, which is described by the following equation:

$$Vds(sat) < Vgs - Vt \quad [1]$$

wherein Vds(sat) is the drain-to-source voltage in the saturation region, Vgs is the gate-to-source voltage, and Vt is the threshold voltage of the transistor. Low power consumption is also maintained since transistors m2, m3, m4 and m5 are fairly long length (L) devices.

Therefore, before transistor m4 becomes saturated, P-channel transistor m3 is turned off. This is accomplished by the FDBK feedback signal. Once the feedback node 18 becomes high enough (approximately 50%, of VDD) then NOR gate N2 supplies a logic high to P-channel transistor m3 (via inverter N3). Subsequently, transistor m3 turns off, which allows N-channel transistor m2 to pull down the INT node 16 to ground. This, in turn, turns off N-channel transistor m4 and allows P-channel transistor m5 to drive the FDBK node 18 up to VDD and supply the output node 14 with a full ground level. The capacitive load, capacitor-connected N-channel transistor m6, is used to further slow the time response of the FDBK node 18 and extend the time delay of the output signal at node 14. Note that the gate of transistor m6 forms one of the plates of the capacitor and the coupled source and drain forms the other plate of the capacitor. Finally, inverter N4 inverts the FDBK feedback signal once it reaches approximately 75% of VDD. To extend the time delay even further, it is desirable to use a Schmitt trigger for the last stage instead of an inverter as shown in FIG. 1, so that the output can trigger at a higher feedback voltage.

The waveforms for the IN, OUT, FDBK, and INT signals can seen in the timing diagram of FIG. 2. These waveforms are denoted by their respective node numbers, i.e. 12, 14, 18, and 16. The input waveform 12 is shown as a negative-going pulse, the leading edge occurring at time t1, and the trailing edge occurring at time t5. The output signal waveform 14 is also a negative-going pulse, but note that the leading edge has been delayed and does not occur until time t4. The response of the feedback signal 18 resembles that of a typical RC response signal, which transitions from low to high from times greater than t1 until time t5. At time t5 the input signal 12 transitions from low to high and forces the FDBK signal 18 to VSS (ground in the preferred embodiment). The INT waveform 16 is fairly complex. Referring to both FIGS. 1 and 2, as transistors m2 and m3 begin conducting, the INT node 16 begins transitioning low until the point of saturation of transistors m2 and m3, which is at time t2. From this point in time, the FDBK node 18 keeps transitioning up towards VDD and the INT node 16 remains at a constant reference voltage. The constant reference voltage is maintained until the FDBK node 18 reaches 50% of VDD and subsequently turns off transistor m3 via NOR gate N2 and inverter N3. When this occurs, transistor m2 remains on, which pulls the INT node 16 to ground at time t3 and remains at VSS (ground) until the input signal IN switches from low to high at time t5. At time t5 the INT node 16 is immediately driven to VDD.

First Alternative Embodiment

Figure 3:
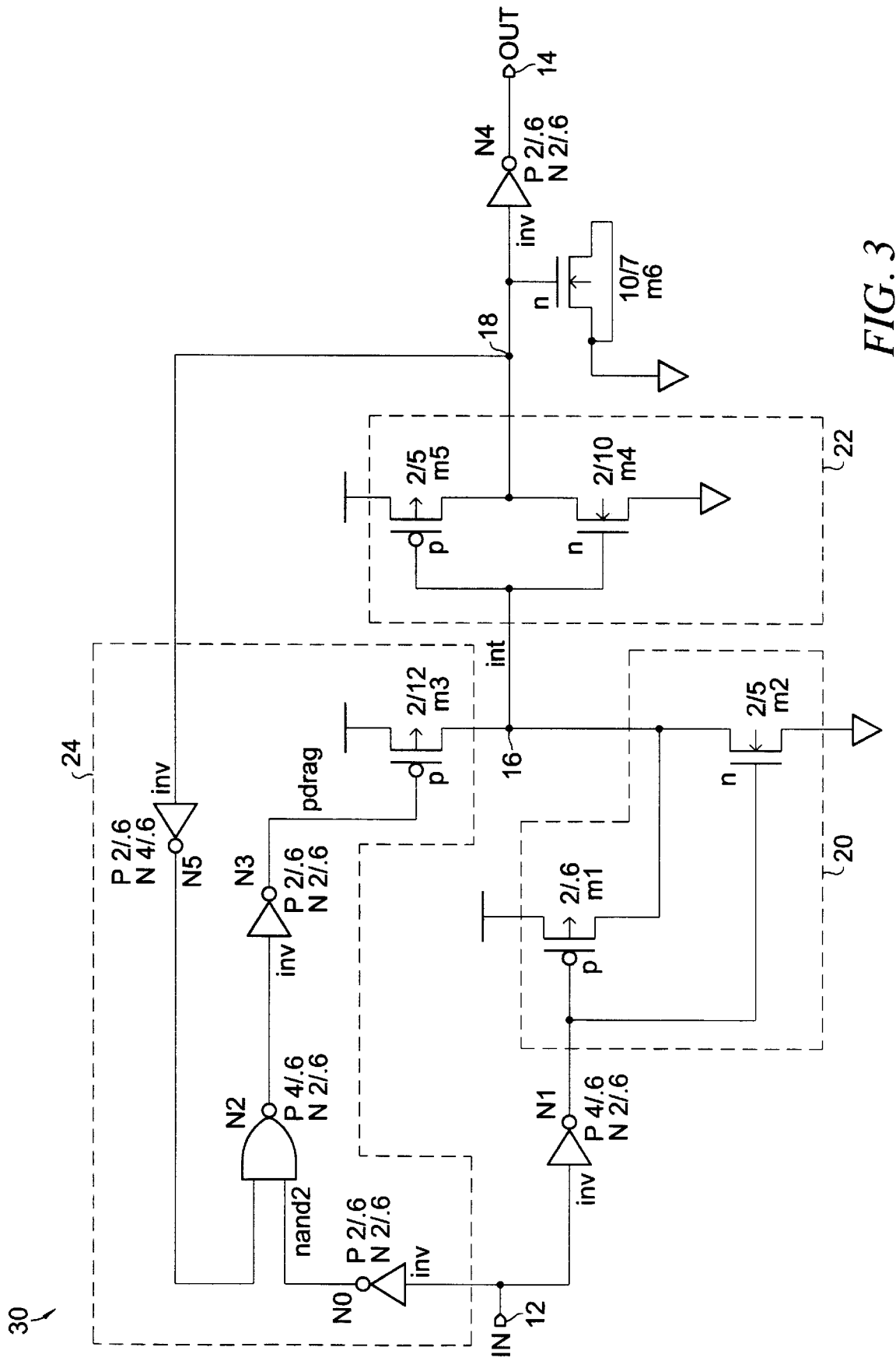
FIGS. 3–4 and 6–8 are schematic diagrams of alternative embodiments of an RC equivalent delay circuit according to the present invention.

An alternative delay circuit 30 is shown in FIG. 3 in which switch 24 includes a NAND gate N2 having first and second inverted inputs (via inverters N0 and N5), an inverter N3, and a P-channel transistor m3. The first and second inverted inputs of the NAND gate N2 form the first and second inputs of the switch 24. The output of the NAND gate N2 is coupled to the input of the inverter N3. The output of inverter N3 is coupled to the gate of P-channel transistor m3, the source is coupled to the VDD supply voltage, and the drain forms the output of the switch at node 16.

The primary difference between circuit embodiment 30, shown in FIG. 3, and delay circuit 10 shown in FIG. 1 is that a NAND gate with inverter inputs is used instead of a NOR gate. Circuit 30 functions in exactly the same way as described above with reference to delay circuit 10. Delay circuit 30 delays an input signal which switches from high to low, only. The waveform timing diagram for circuit 30 is identical to that of FIG. 2.

Second Alternative Embodiment

Figure 4:
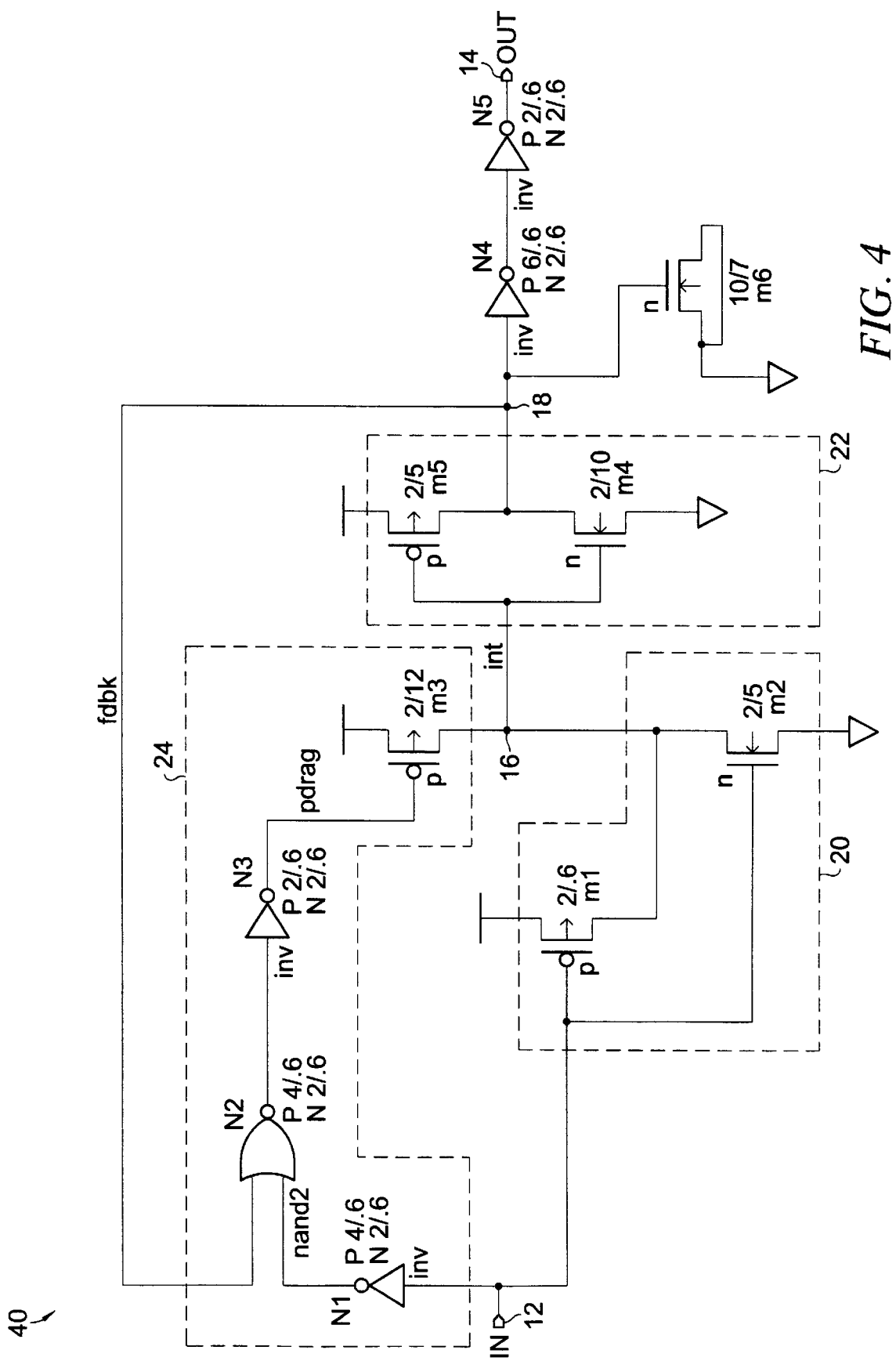

A second alternative delay circuit 40 is shown in FIG. 4 in which switch 24 includes a NOR gate N2 having an inverted input (via inverter N1) and a non-inverted input, an inverter N3, and a P-channel transistor m3. The inverted input and the non-inverted input of the NOR gate N2 respectively form the first and second inputs of switch 24. The output of NOR gate N2 is coupled to the input of inverter N3. The output of inverter N3 is coupled to the gate of the P-channel transistor m3, the source is coupled to the VDD supply voltage, and the drain forms the output of switch 24 at node 16.

Figure 5:
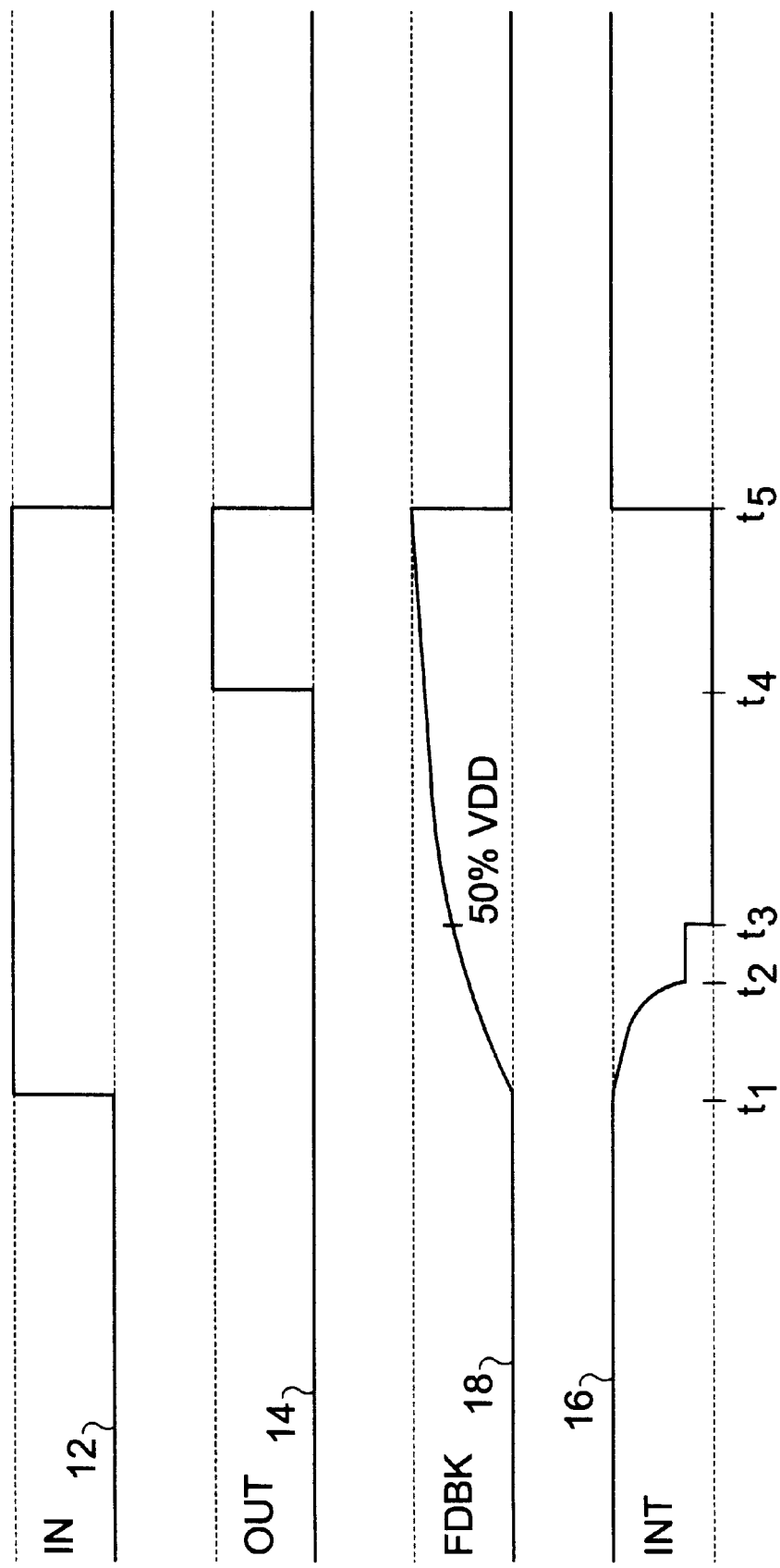
FIG. 5 is a timing diagram showing various waveforms associated with circuit nodes in the circuit of FIG. 4.

Delay circuit 40 shown in FIG. 4 functions as a delay circuit for inputs switching from low to high instead of high to low as shown in the timing diagram of FIG. 5. Essentially, the circuit functions in the same manner as delay circuit 10 shown in FIG. 1, except that one extra inverter N5 is inserted into the circuit, which is interposed between inverter N4 and output node 14 in order to invert the output signal to the correct logic level. Another difference is that inverter N1 is used to drive one of the inputs of NOR gate N2. Therefore, when the input signal switches from low to high instead of high to low, P-channel transistor m3 turns on via NOR gate N2 and inverter N3.

The waveforms for the IN, OUT, FDBK, and INT signals can seen in the timing diagram of FIG. 5. These waveforms are denoted by their respective node numbers, i.e. 12, 14, 18, and 16. The input waveform 12 is shown as a positive-going pulse, the leading edge occurring at time t1, and the trailing edge occurring at time t5. The output signal waveform 14 is also a positive-going pulse, but note that the leading edge has been delayed and does not occur until time t4. The response of the feedback signal 18 resembles that of a typical RC response signal. The INT waveform 16 functions exactly the same as was described in the preferred embodiment with respect to FIG. 2. However, since circuit 40 includes an additional inverter N5 at the output, the OUT node 14 is inverted to provide the proper logic state.

Third Alternative Embodiment

Figure 6:
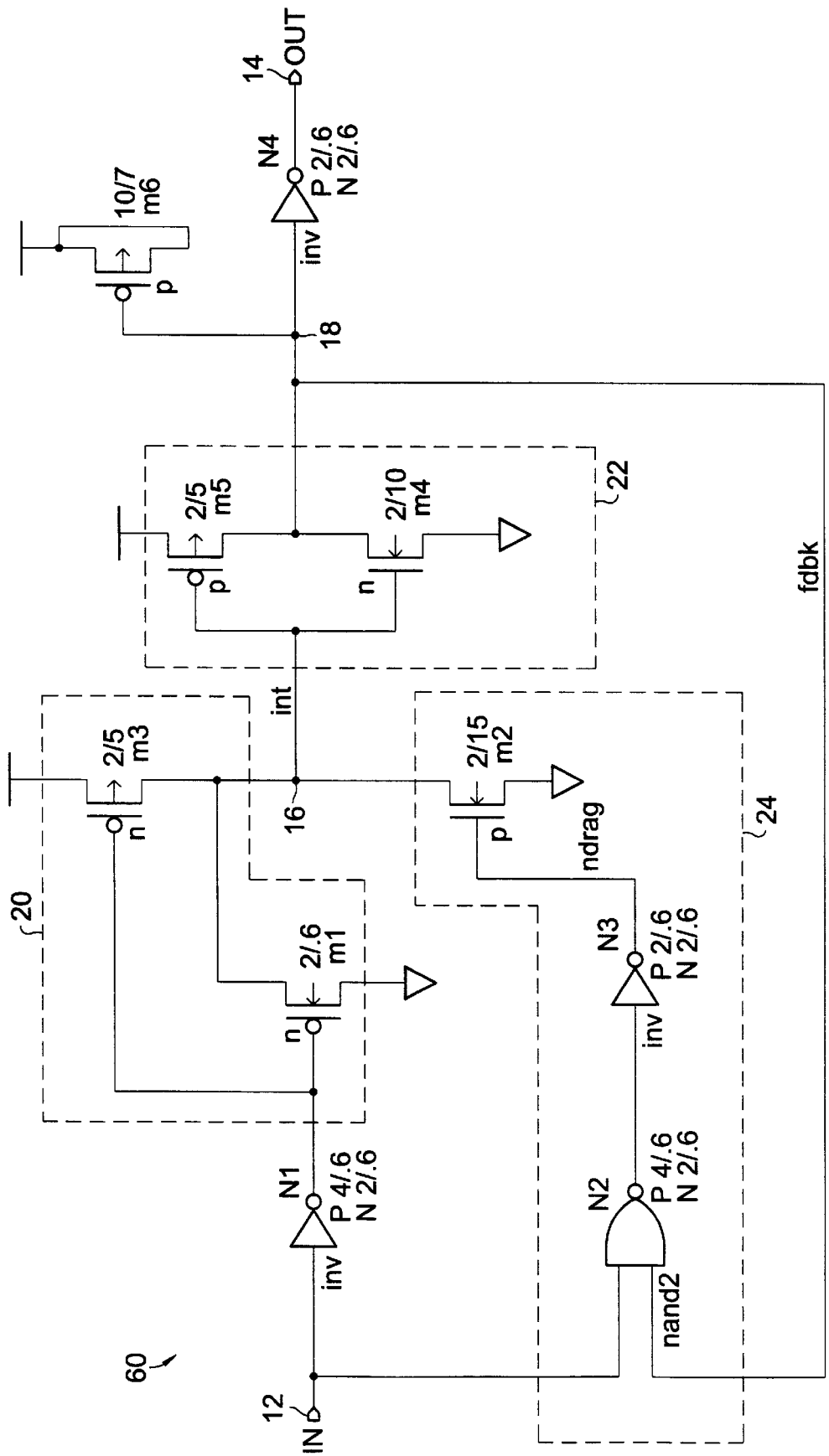

A third alternative delay circuit 60 is shown in FIG. 6 in which switch 24 includes a NAND gate N2, an inverter N3, and an N-channel transistor m2. The first and second inputs of NAND gate N2 form the first and second inputs of switch 24. The output of NAND gate N2 is coupled to the input of inverter N3. The output of inverter N3 is coupled to the gate of N-channel transistor m2, the source is coupled to ground, and the drain forms the output of switch 24 at node 16.

Another way to accomplish the same RC type response signal is to turn off an N-channel transistor instead of a P-channel transistor when the FDBK feedback signal is low enough so that NAND gate N2 can supply a low to the gate of N-channel transistor m2. Also, because the feedback node switches low for N-channel transistor m2 to turn off, a PMOS capacitor load (capacitor-connected P-channel transistor m6) is used instead of an NMOS capacitor so that extra delay is included in the response.

Figure 9:
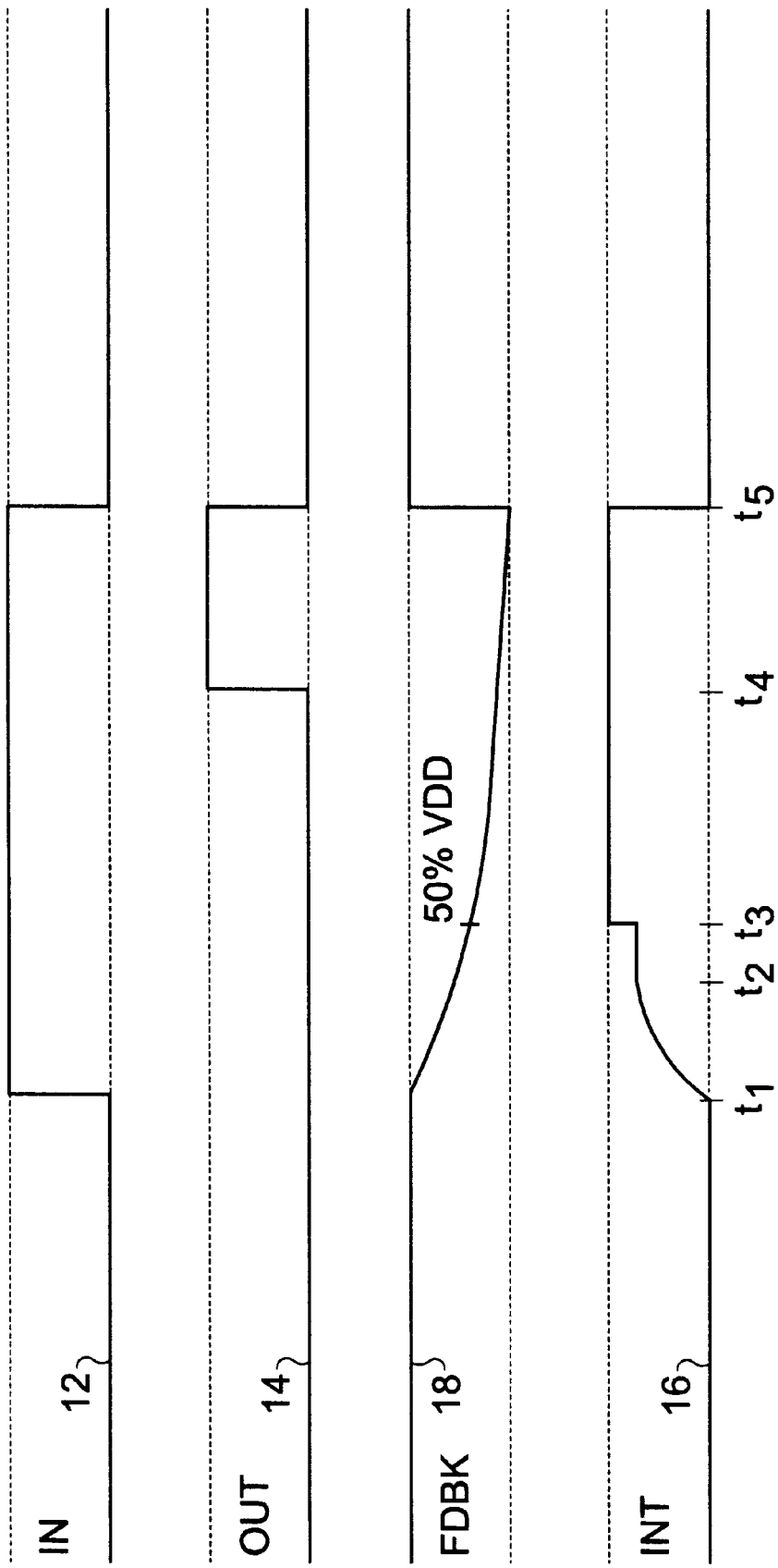
FIG. 9 is a timing diagram showing various waveforms associated with circuit nodes in the circuit of FIG. 6.

Delay circuit 60 functions as a delay circuit for inputs switching from low to high, only, which is shown in the timing diagram of FIG. 9. The IN, OUT, FDBK, and INT waveforms shown are denoted by their respective node numbers, i.e. 12, 14, 18 and 16. The input waveform 12 is shown as a positive-going pulse, the leading edge occurring at time t1 and the falling edge occurring at time t5. The output signal waveform 14 is also a positive-going pulse but delayed a certain amount of time which is shown at time t4. The feedback signal 18 is inverter with respect to the signal shown in FIG. 2. In other words, the FDBK node 18 starts high and transitions low until time t5. The INT node 16 initially is low and once the input switches high, the INT node 16 transitions towards VDD until transistors m2 and m3 are saturated at time t2. From this point, the FDBK node 18 reaches approximately 50% of VDD, transistor m2 shuts off via NAND gate N2 and inverter N3. Transistor m3 forces the INT signal to VDD at time t3. The FDBK and INT signals remain the same until the input switches from high to low. At time t5 the FDBK and INT nodes become high and low, respectively.

Fourth Alternative Embodiment

Figure 7:
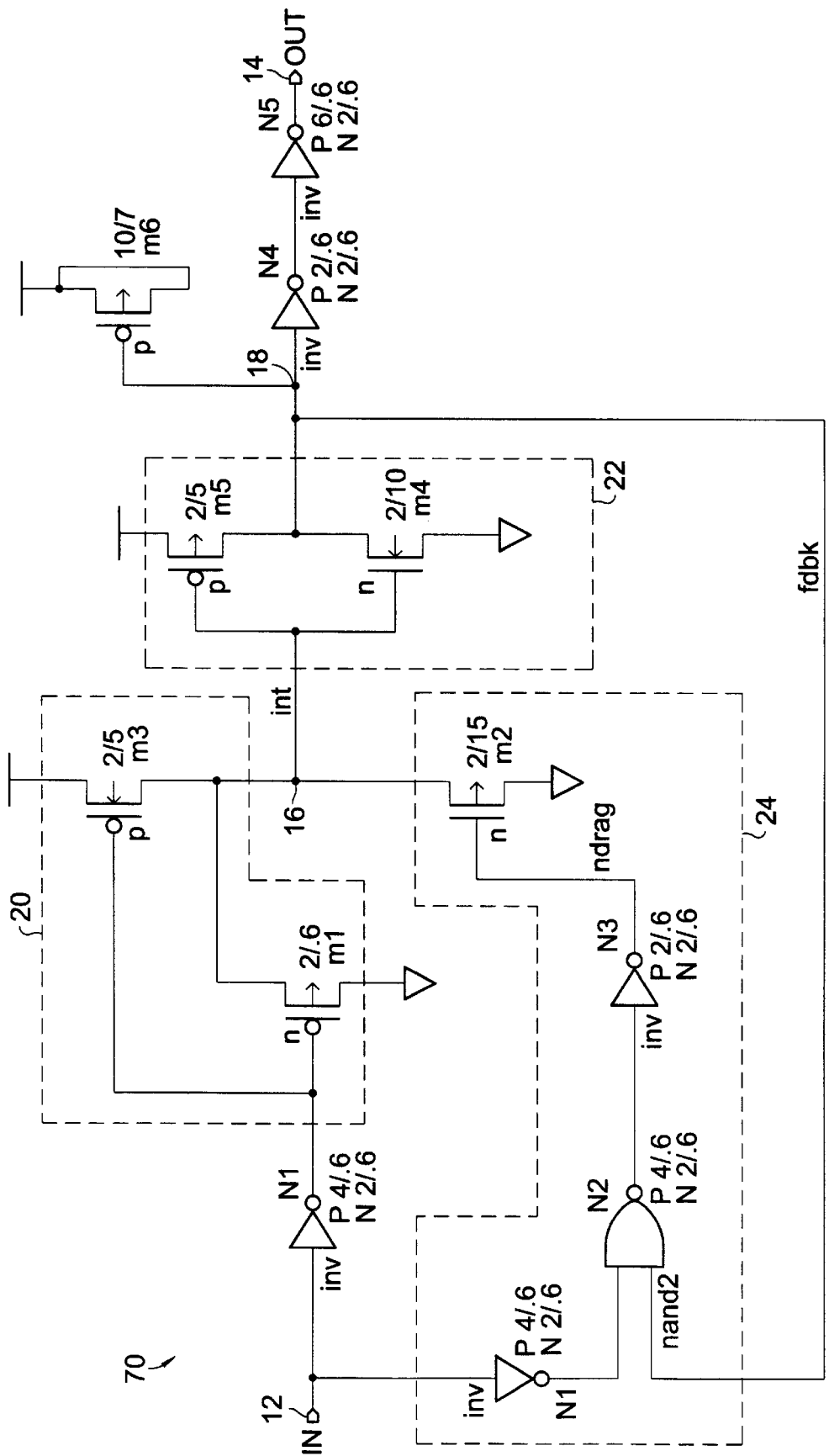

A third alternative delay circuit 70 is shown in FIG. 7 in which switch 24 includes comprises a NAND gate N2 having an inverted input (via inverter N1) and a non-inverted input, an inverter N3, and an N-channel transistor m2. The inverted input and the non-inverted input of NAND gate N2 respectively form the first and second inputs of switch 24. The output of NAND gate N2 is coupled to the input of inverter N3. The output of inverter N3 is coupled to the gate of N-channel transistor m2, the source is coupled to ground, and the drain forms the output of switch 24 at node 16.

Delay circuit 70 shown in FIG. 7 is essentially the same as delay circuit 60 previously described above with respect to FIG. 6, except that inverter N1 is moved to the input of NAND gate N2. Circuit 70 functions as an RC delay for the input switching from high to low, which is opposite to the function of delay circuit 60. Also, the output includes an extra inverter N5 for a proper output logic state.

Figure 10:
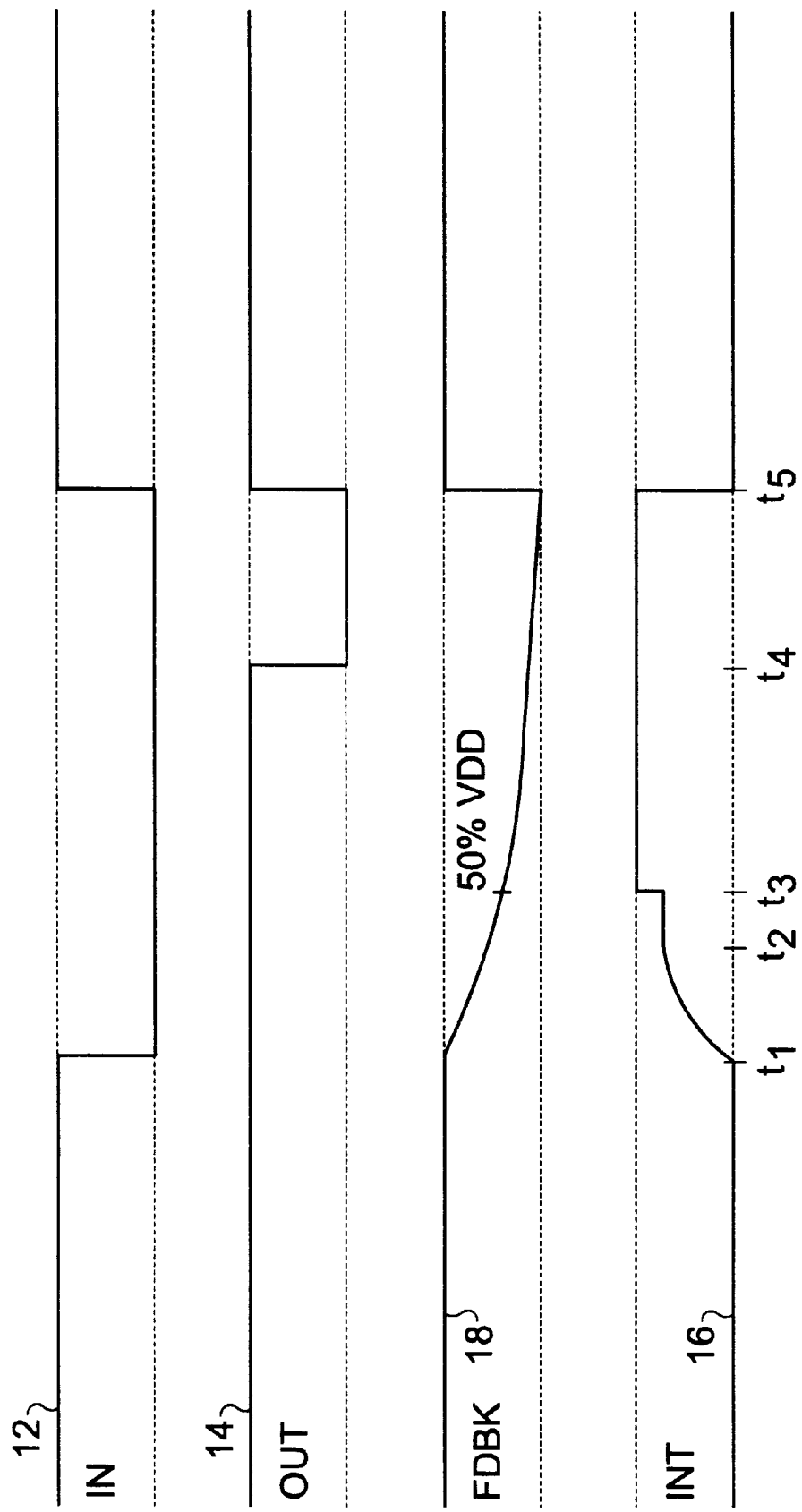
FIG. 10 is a timing diagram showing various waveforms associated with circuit nodes in the circuit of FIG. 7.

The waveforms for delay circuit 70 are shown in FIG. 10. The FDBK and INT signals are identical to those described above and shown in FIG. 9. The IN and OUT signals are inverted due to the extra inverter on the output and the placement of inverter N1 at the input.

Fifth Alternative Embodiment

Figure 8:
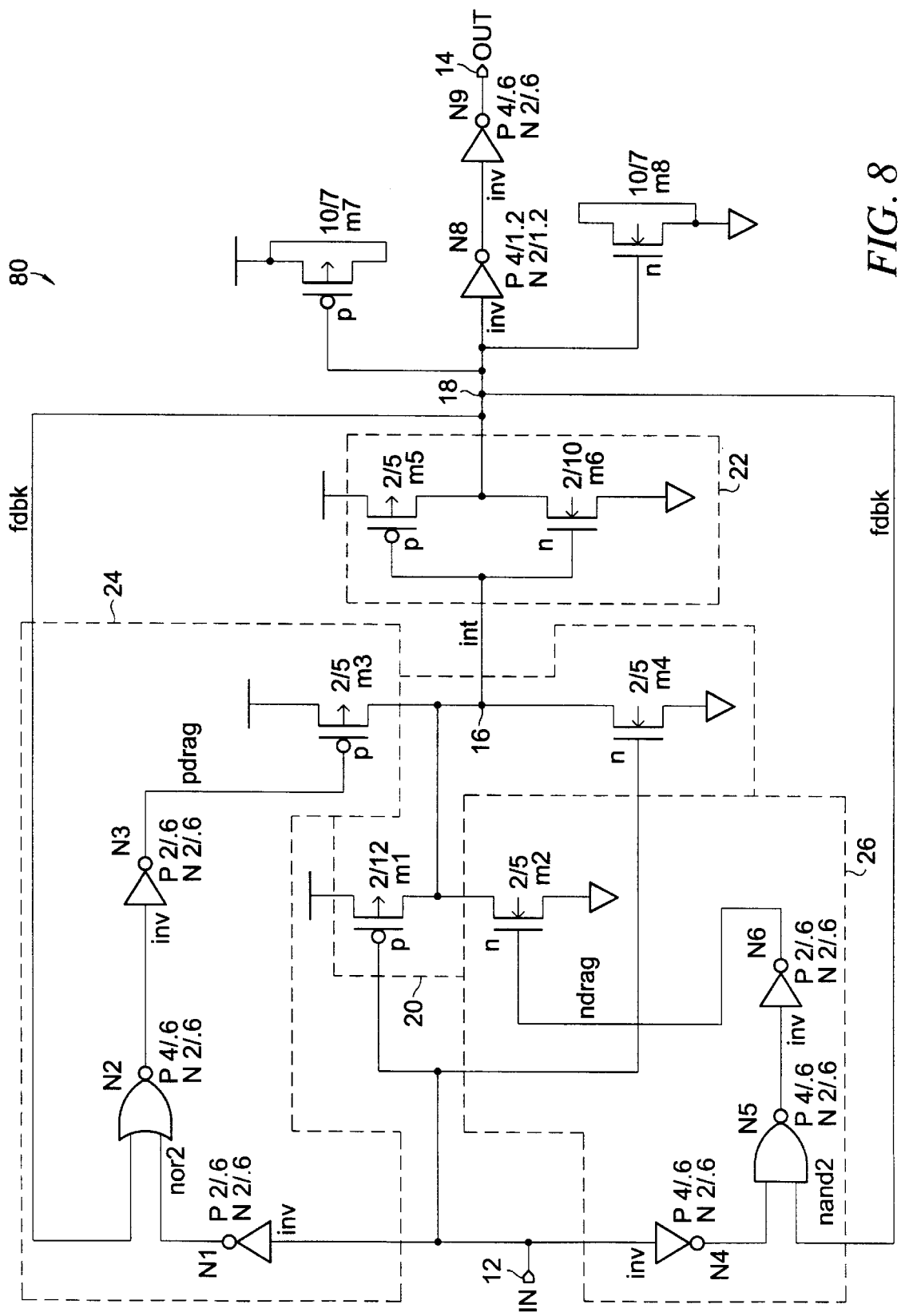

Delay circuit 80 shown in FIG. 8 includes an input node 12 designated IN, an output node 14 designated OUT, a feedback node 18 designated FDBK, and an intermediate node 16 designated INT. A first inverter 20 has an input coupled to the input node 12 and an output coupled to the intermediate node 16. A second inverter 22 has an input coupled to the intermediate node 16 and an output coupled to the feedback node 18. Third and fourth inverters N8 and N9 are serially coupled between the feedback node 18 and the output node 14. A first switch 24 has a first input coupled to the input node 12, a second input coupled to the feedback node 18, and an output coupled to the intermediate node 16. A second switch 26 has a first input coupled to the input node 12, a second input coupled to the feedback node 18, and an output coupled to the intermediate node 16.

Inverters 20, 22, N8 and N9 each includes a P-channel transistor and an N-channel transistor having coupled gates forming the input, and coupled drains forming the output.

The first switch 24 includes a NOR gate N2 having an inverted input (via inverter N1) and a non-inverted input, an inverter N3, and a P-channel transistor m3. The inverted input and the non-inverted input of NOR gate N2 respectively form the first and second inputs of switch 24. The output of NOR gate N2 is coupled to the input of inverter N3. The output of inverter N3 is coupled to the gate of P-channel transistor m3, the source is coupled to the VDD supply voltage, and the drain forms the output of switch 24 at node 16.

The second switch 26 includes a NAND gate N5 having an inverted input (via inverter N4) and a non-inverted input, an inverter N6, and an N-channel transistor m2. The inverted input and the non-inverted input of NAND gate N5 respectively form the first and second inputs of switch 26. The output of NAND gate N5 is coupled to the input of inverter N6. The output of inverter N6 is coupled to the gate of N-channel transistor m2, the source is coupled to ground, and the drain forms the output of switch 26 at node 16.

Delay circuit 80 further includes first and second capacitive loads (diode-connected transistors m7 and m8) coupled to feedback node 18.

Delay circuit 80 shown in FIG. 8 works for input signals switching low or high and is used for applications where an RC response or time delay is required for both switched states. Since there are now two feedback signal paths, one going to NOR gate N2 and one to NAND gate N5, delay circuit 80 turns off the appropriate device when the feedback signal transitions from low to high or vice versa. For the power up state, there is virtually no delay since both transistors m2 and m3 are in cutoff. For instance, if the input signal, IN, starts at a logic high, then transistor m4 turns on, which supplies the FDBK feedback signals with a logic high which subsequently supplies the gate of m3 with a high, keeping it in the cutoff region. Furthermore, since the input is high, the input to NAND gate N5 via inverter N4 is low, which will keep transistor m2 in cutoff. If circuit 80 powers up low, then transistor m1 turns on, supplying FDBK node 18 with a low, which keeps transistor m2 off. Since the input is low inverter N1 supplies the input of NOR gate N2 with a high, which keeps transistor m3 off. Therefore, it does not matter whether the input powers up at a low or high state, either transistor m2 nor m3 are conducting. Now, if we assume that the input power up high and then transitions low, then the input to NOR gate N2 is high, which keeps transistor m3 off. The input to NAND gate N5 is also high, which will essentially drive transistor m2 into conduction, since the feedback signal is at a logic high level at this particular instance in time. Furthermore, transistor m1 turns on at approximately the same time, which provides a slow response due to the long L devices. At this point, both transistors m1 and m2 are conducting. As the INT node 16 slowly transitions from low to high, a voltage reference is established at the point of saturation. In this case, transistors m1 and m2 are ideally sized so that a reference voltage of approximately 70%. of VDD (3.5 volts for a five volt VDD power supply voltage) is established, since the feedback node FDBK is transitioning from high to low. Therefore, the N-channel transistor m6 has a higher Vgs than P-channel transistor m5, and yet low enough to slowly pull the feedback node 18 to ground. As transistor m6 slowly pulls the feedback node 18 towards ground, the drain to source voltage of P-channel transistor m5 increases causing it to operate in the linear mode.

As referred to above in conjunction with other embodiments of the present invention, it is desirable to limit the current flow by turning off one of the conducting devices (m2 or m3). In this particular case, N-channel transistor m2 is shut off via the FDBK feedback signal once it reaches approximately 50% of VDD and P-channel transistor m1 completes the transition by pulling up the INT node to VDD and transistor m6 forces the FDBK node to ground. The PMOS capacitor, m7, is used to once again slow the transition time for the FDBK node switching from high to low. This particular signal is then buffered to the output to supply the appropriate state by inverters N8 and N9.

Figure 11:
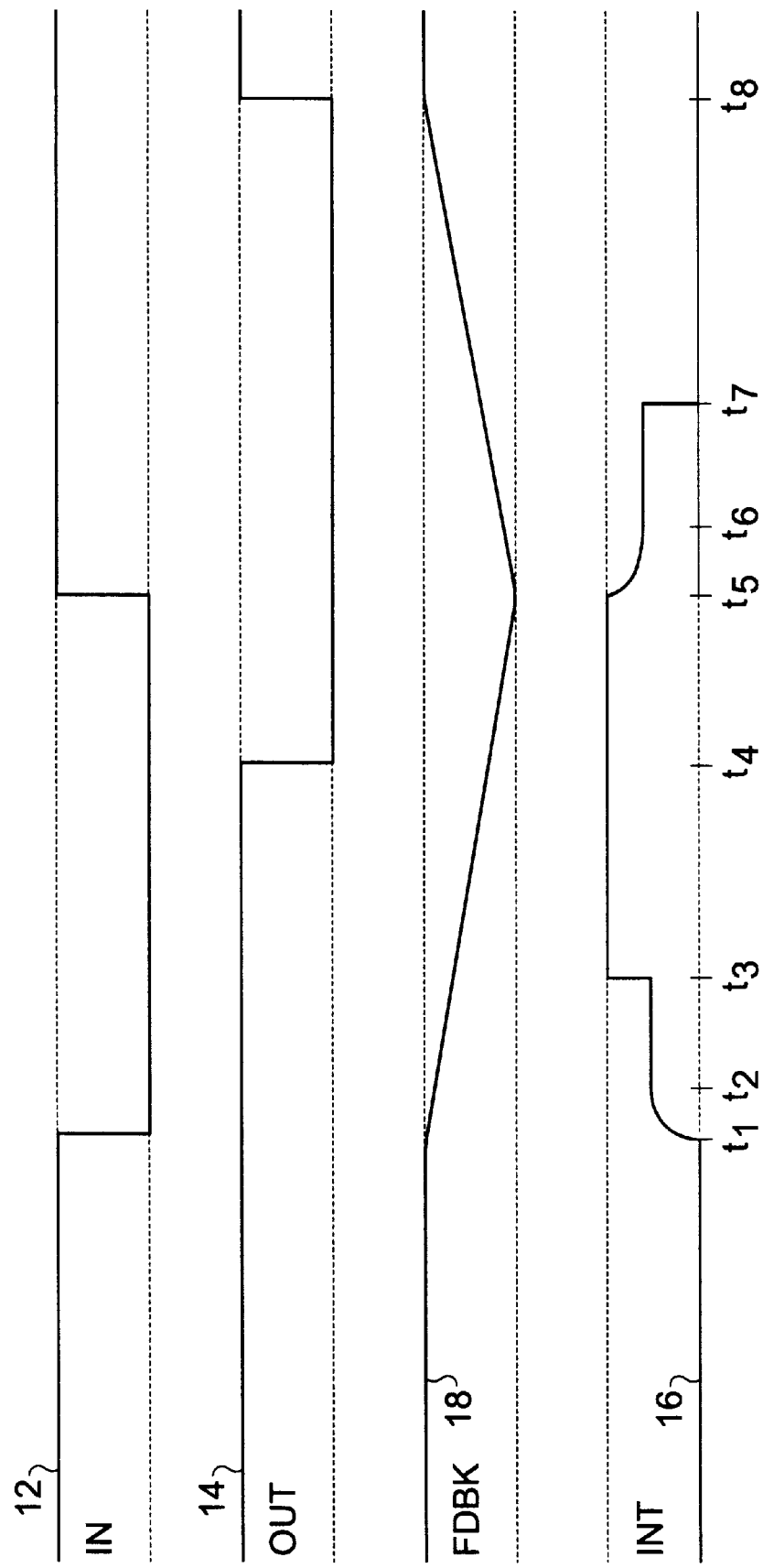
FIG. 11 is a timing diagram showing various waveforms associated with circuit nodes in the circuit of FIG. 8.

When the input transitions high, the input to NAND gate N5 is still low because the feedback node is low and the input to NOR gate N2 is low. Since the feedback node is low, transistors m3 and m4 also turn on. The behavior of delay circuit 80 is further illustrated with reference to the timing diagram of FIG. 11.

Design Concerns

A concern in using the delay circuits taught herein is that they can draw substantial operating current unless proper device selection is used. The amount of current drawn depends upon how long of a delay is desired, and the length of the device channels. Therefore, it is highly desirable that the devices that contribute to crowbar current (when both P-channel and N-channel transistors are conducting, for example transistors m2 and m3 in FIG. 8) are made as weak as possible. In other words, devices with long lengths should be used not only to limit current flow, but also to contribute to longer response and hence longer delay times. Also, as was mentioned above, current flow can be limited by the use of the feedback signal to shut off one of the conducting devices at the appropriate time.

CMOS RC Theory

In adapting the present invention and, in particular, the P-channel and N-channel stack (inverter) to various operating conditions, it may be helpful to refer to the following equations. From device physics, equation [2] is used to describe the device linear current:

$$Ids = \mu CoxW/L[(Vgs-Vt)Vds-Vds^2/2] \quad [2]$$

Therefore, as the length of the device increases, the drain to source current (Ids) decreases. Furthermore, if one device is operating in the linear region, current is not only limited but also the response of the output is an RC type response. This is because the device is acting as a resistor and there is an associated load capacitance, namely, gate-to-source (Cgs), gate-to-drain (Cgd), and gate-to-substrate overlap (Cgbo) capacitance. Therefore, the longer the channel length, the lower the Ids and the larger the ON resistance of the device. The resistance can be estimated by equation [3]:

$$Rchannel = k(L/W) \quad [3]$$

where $$k = 1/[\mu Cox(Vgs-Vt)] \quad [4]$$

Improved Performance versus Conventional RC Circuit Elements

When using the designs of the present invention versus conventional RC design methods, it has been shown through computer simulations to have better performance with respect to variations in process, temperature, and voltage. The drain-to-source current equations for the linear [5] and saturation [6] regions are as follows:

$$Ids(sat) = \mu coxW/L[(vgs-vt)Vds-Vds^2/2] \quad [5]$$

$$Ids(lin) = \mu CoxW/2L[(vgs-vt)^2] \quad [6]$$

For an increase in temperature, the mobility ($\mu$) of a device decreases and the intrinsic concentration also increases. Therefore, the bulk potential increases, which implies that the threshold voltage increases. Therefore, the fact that the threshold voltage, Vt, increases and mobility decreases results in a decrease in the drain-to-source current. However, if the device is operating in the linear region, the effect of temperature is minimized by comparison to the device operating in the saturation region. This is because the drain-to-source voltage, Vds, is taken into account for the linear region to limit the bracketed term [(vgs-vt)Vds-Vds$^2$/2]. Furthermore, the gate-to-source voltage, Vgs, for the circuit of the present invention is lower due to the reference voltage which is generated at the input to the long L inverter to further minimize the effect of temperature. The same principle applies to poor processing, where the threshold voltages are raised. Simulations show that there is an improvement in circuit performance with respect to variations in voltage, temperature, and processing. Using 0.6$\mu$ process models, the results comparing the present invention and an RC circuit using N-well resistors are shown in the following table. The difference in circuit area is also shown in the table. Time delay refers to the time between the input switching from high to low to the output switching from high to low.

|  | Time Delay (Input to Output) | |
| --- | --- | --- |
| Condition | CMOS RC | Conventional RC |
| (1) 5 volts, 25° C. | 60 ns | 60 ns |
| (2) 4.4 volts, 90° C. | 68 ns | 75 ns |
| (3) 5.6 volts, −45° C. | 49 ns | 45 ns |
| 4) [(2) − (3)] | 19 ns | 30 ns |
| 5) Circuit Area | 480 square microns | 1950 square microns |

Having described and illustrated the principle of the invention in a preferred embodiment thereof, it is appreciated by those having skill in the art that the invention can be modified in arrangement and detail without departing from such principles. For example, any of the device lengths can be changed by making them longer to increase the delay time or shorter to decrease the delay time. Also, as was mentioned earlier, a Schmitt trigger circuit can be substituted for an inverter on the output to lengthen the delay time. The load NMOS and/or PMOS capacitors can be increased in size to once again slow down the transition of the feedback signal. Different reference voltages can be obtained by adjusting the widths and lengths of the associated devices. The trip points of the NAND and/or NOR gates can be adjusted by varying the gate sizes of the corresponding devices. I therefore claim all modifications and variations coming within the spirit and scope of the following claims.

I claim:

1. A delay circuit comprising:
   an input node, an output node, a feedback node, and an intermediate node;
   a first inverter having an input coupled to the input node and an output coupled to the intermediate node;

a second inverter having an input coupled to the intermediate node and an output coupled to the feedback node;

a third inverter having an input coupled to the feedback node and an output coupled to the output node; and a switch having a first input coupled to the input node, a second input coupled to the feedback node, and an output coupled to the intermediate node, wherein the switch further comprises:

a NOR gate having first and second inputs, and an output;

an inverter having an input and an output; and a P-channel transistor having a gate, a source, and a drain, and wherein the first and second inputs of the NOR gate form the first and second inputs of the switch, the output of the NOR gate is coupled to the input of the inverter, the output of the inverter is coupled to the gate of the P-channel transistor, the source of the P-channel transistor is coupled to a source of supply voltage, and the drain of the P-channel transistor forms the output of the switch.

2. A delay circuit comprising:

an input node, an output node, a feedback node, and an intermediate node;

a first inverter having an input coupled to the input node and an output coupled to the intermediate node;

a second inverter having an input coupled to the intermediate node and an output coupled to the feedback node;

a third inverter having an input coupled to the feedback node and an output coupled to the output node; and a switch having a first input coupled to the input node, a second input coupled to the feedback node, and an output coupled to the intermediate node, wherein the switch further comprises:

a NOR gate having an inverted input, a non-inverted input, and an output;

an inverter having an input and an output; and a P-channel transistor having a gate, a source, and a drain, and wherein the inverted input and the non-inverted input of the NOR gate respectively form the first and second inputs of the switch, the output of the NOR gate is coupled to the input of the inverter, the output of the inverter is coupled to the gate of the P-channel transistor, the source of the P-channel transistor is coupled to a source of supply voltage, and the drain of the P-channel transistor forms the output of the switch.

3. A delay circuit comprising:

an input node, an output node, a feedback node, and an intermediate node;

a first inverter having an input coupled to the input node and an output coupled to the intermediate node;

a second inverter having an input coupled to the intermediate node and an output coupled to the feedback node;

a third inverter having an input coupled to the feedback node and an output coupled to the output node; and a switch having a first input coupled to the input node, a second input coupled to the feedback node, and an output coupled to the intermediate node, wherein the switch further comprises:

a NAND gate having first and second inverted inputs, and an output;

an inverter having an input and an output; and a P-channel transistor having a gate, a source, and a drain, and wherein the first and second inverted inputs of the NAND gate form the first and second inputs of the switch, the output of the NAND gate is coupled to the input of the inverter, the output of the inverter is coupled to the gate of the P-channel transistor, the source of the P-channel transistor is coupled to a source of supply voltage, and the drain of the P-channel transistor forms the output of the switch.

4. A delay circuit comprising:

an input node, an output node, a feedback node, and an intermediate node;

a first inverter having an input coupled to the input node and an output coupled to the intermediate node;

a second inverter having an input coupled to the intermediate node and an output coupled to the feedback node;

a third inverter having an input coupled to the feedback node and an output coupled to the output node; and a switch having a first input coupled to the input node, a second input coupled to the feedback node, and an output coupled to the intermediate node, wherein the switch further comprises:

a NAND gate having first and second inputs, and an output;

an inverter having an input and an output; and an N-channel transistor having a gate, a source, and a drain, and wherein the first and second inputs of the NAND gate form the first and second inputs of the switch, the output of the NAND gate is coupled to the input of the inverter, the output of the inverter is coupled to the gate of the N-channel transistor, the source of the N-channel transistor is coupled to ground, and the drain of the N-channel transistor forms the output of the switch.

5. A delay circuit comprising:

an input node, an output node, a feedback node, and an intermediate node;

a first inverter having an input coupled to the input node and an output coupled to the intermediate node;

a second inverter having an input coupled to the intermediate node and an output coupled to the feedback node;

a third inverter having an input coupled to the feedback node and an output coupled to the output node; and a switch having a first input coupled to the input node, a second input coupled to the feedback node, and an output coupled to the intermediate node, wherein the switch further comprises:

a NAND gate having an inverted input, and non-inverted input, and an output;

an inverter having an input and an output; and an N-channel transistor having a gate, a source, and a drain, and wherein the inverted input and the non-inverted input of the NAND gate respectively form the first and second inputs of the switch, the output of the NAND gate is coupled to the input of the inverter, the output of the inverter is coupled to the gate of the N-channel transistor, the source of the N-channel transistor is coupled to ground, and the drain of the N-channel transistor forms the output of the switch.

6. A delay circuit comprising:

an input node, an output node, a feedback node, and an intermediate node;

a first inverter having an input coupled to the input node and an output coupled to the intermediate node;

a second inverter having an input coupled to the intermediate node and an output coupled to the feedback node;

a third inverter having an input coupled to the feedback node and an output coupled to the output node;

a first switch having a first input coupled to the input node, a second input coupled to the feedback node, and an output coupled to the intermediate node; and a second switch having a first input coupled to the input node, a second input coupled to the feedback node, and an output coupled to the intermediate node, wherein the first switch further comprises:

a NOR gate having an inverted input, a non-inverted input, and an output;

an inverter having an input and an output; and a P-channel transistor having a gate, a source, and a drain, and wherein the inverted input and the non-inverted input of the NOR gate respectively form the first and second inputs of the switch, the output of the NOR gate is coupled to the input of the inverter, the output of the inverter is coupled to the gate of the P-channel transistor, the source of the P-channel transistor is coupled to a source of supply voltage, and the drain of the P-channel transistor forms the output of the switch.

7. A delay circuit comprising:

an input node, an output node, a feedback node, and an intermediate node;

a first inverter having an input coupled to the input node and an output coupled to the intermediate node;

a second inverter having an input coupled to the intermediate node and an output coupled to the feedback node;

a third inverter having an input coupled to the feedback node and an output coupled to the output node;

a first switch having a first input coupled to the input node, a second input coupled to the feedback node, and an output coupled to the intermediate node; and a second switch having a first input coupled to the input node, a second input coupled to the feedback node, and an output coupled to the intermediate node, wherein the second switch further comprises:

a NAND gate having an inverted input, a non-inverted input, and an output;

an inverter having an input and an output; and an N-channel transistor having a gate, a source, and a drain, and wherein the inverted input and the non-inverted input of the NAND gate respectively form the first and second inputs of the switch, the output of the NAND gate is coupled to the input of the inverter, the output of the inverter is coupled to the gate of the N-channel transistor, the source of the N-channel transistor is coupled to ground, and the drain of the N-channel transistor forms the output of the switch.

* * * * *